(12) United States Patent
Fu et al.

(10) Patent No.: US 9,123,659 B1
(45) Date of Patent: Sep. 1, 2015

(54) METHOD FOR MANUFACTURING FINFET DEVICE

(71) Applicant: UNITED MICROELECTRONICS CORPORATION, Hsinchu (TW)

(72) Inventors: Ssu-I Fu, Kaohsiung (TW); Shih-Hung Tsai, Tainan (TW); Yu-Hsiang Hung, Tainan (TW); Li-Wei Feng, Kaohsiung (TW); Jyh-Shyang Jenq, Tainan (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/516,554

(22) Filed: Oct. 16, 2014

(30) Foreign Application Priority Data

Aug. 6, 2014 (TW) .............................. 103126975 A

(51) Int. Cl.
*H01L 27/088* (2006.01)
*H01L 21/308* (2006.01)
*H01L 29/66* (2006.01)
*H01L 21/762* (2006.01)
*H01L 27/108* (2006.01)
*H01L 21/033* (2006.01)

(52) U.S. Cl.
CPC ........ *H01L 21/3086* (2013.01); *H01L 21/3081* (2013.01); *H01L 21/76224* (2013.01); *H01L 27/0886* (2013.01); *H01L 27/10879* (2013.01); *H01L 29/66795* (2013.01); *H01L 21/0334* (2013.01); *H01L 21/3083* (2013.01)

(58) Field of Classification Search
CPC .................... H01L 21/02365; H01L 21/02518
See application file for complete search history.

(56) References Cited

U.S. PATENT DOCUMENTS

| 6,063,688 A | 5/2000 | Doyle | |
|---|---|---|---|
| 2014/0264717 A1* | 9/2014 | Shieh et al. | 257/499 |

OTHER PUBLICATIONS

U.S. Appl. No. 13/786,485, filed Mar. 6, 2013, First Named Inventor: Tsai, Shih-Hung, Title: Method for Forming Fin-Shaped Structures.

* cited by examiner

*Primary Examiner* — Cheung Lee
(74) *Attorney, Agent, or Firm* — Ding Yu Tan

(57) ABSTRACT

A method for manufacturing a finFET device is provided. Firstly, a first multiple layer structure and a second multiple layer structure are formed on a substrate in sequence. Then, a first sacrificial pattern is formed on the second multiple layer structure. A first spacer is next formed on a sidewall of the first sacrificial pattern. Subsequently, a portion of the second multiple layer structure is etched so as to form a second sacrificial pattern by using the first spacer as a hard mask. Next, a second spacer is formed on a sidewall of the second sacrificial pattern. After that, the first multiple layer structure is patterned by using the second spacer as a hard mask. Finally, the substrate is etched so as to form at least a first fin structure by using the patterned first multiple layer structure as a hard mask.

12 Claims, 15 Drawing Sheets

METHOD FOR MANUFACTURING FINFET DEVICE

FIELD OF THE INVENTION

The present invention relates to a method for manufacturing a semiconductor device, and more particularly to a method for manufacturing a finFET device.

BACKGROUND OF THE INVENTION

Due to their fast switching times and high current densities, fin field effect transistor (FinFET) devices are of a desired device architecture. In its basic form, a FinFET device includes a plurality of fin-shaped structures. The fin-shaped structure has a source, a drain and one or more fin-shaped channels between the source and the drain. A gate electrode over the fin(s) regulates electron flow between the source and the drain.

However, as the size of the finFET device shrink, the electrical and physical requirements in each part of the finFET become critical, such as, the sizes and shapes of the fin-shaped structures and the spacing between each fin-shaped structure. Thus, it is desirable to reach standard requirements and overcome the physical limitations in the industry of fin-FET devices.

SUMMARY OF THE INVENTION

In accordance with an aspect, the present invention provides a method for manufacturing a finFET device. Firstly, a first multiple layer structure and a second multiple layer structure are formed on a substrate in sequence. Then, a first sacrificial pattern is formed on the second multiple layer structure. A first spacer is next formed on a sidewall of the first sacrificial pattern. After that, the first sacrificial pattern is removed. Subsequently, the first spacer is used as a hard mask to etch a portion of the second multiple layer structure and thereby a second sacrificial pattern is formed. A second spacer is then formed on a sidewall of the second sacrificial pattern. After that, the second sacrificial pattern is formed. Next, the second spacer is used as a hard mask to pattern the first multiple layer structure. Finally, the patterned first multiple layer structure is used as a hard mask to etch a portion of said substrate and thereby at least one first fin structure is formed.

In one embodiment of the present invention, a first big mandrel is formed on the second multiple layer structure while the step of forming the first sacrificial pattern on the second multiple layer structure is performed In one embodiment of the present invention, the method further includes that covering the first big mandrel before the step of removing said first sacrificial pattern and exposing the first big mandrel after the step of removing the first sacrificial pattern. Besides, the first big mandrel is removed while the step of etching the portion of the second multiple layer structure is performed.

In one embodiment of the present invention, a first middle mandrel is formed on the second multiple layer structure while the step of forming said first sacrificial pattern on the second multiple layer structure is performed. In addition, the first middle mandrel is covered while the step of covering the first big mandrel is performed.

In one embodiment of the present invention, the first middle mandrel is exposed while the step of exposing the first big mandrel is performed. Moreover, the first middle mandrel is removed while the step of etching the portion of the second multiple layer structure.

In one embodiment of the present invention, a second big mandrel is formed on the first multiple layer structure while the step of forming a second sacrificial pattern is performed.

In one embodiment of the present invention, the method further includes that covering the second big mandrel before the step of removing the second sacrificial pattern and exposing the second big mandrel after the step of removing the second sacrificial pattern. Besides, the second big mandrel is removed and a monitor structure is formed while the step of forming the at least one first fin structure is performed.

In one embodiment of the present invention, a second middle mandrel is formed on the first multiple layer structure while the step of forming a second sacrificial pattern is performed.

In one embodiment of the present invention, the method further includes patterning the second middle mandrel before the step of forming said second spacer. Besides, the patterned second middle mandrel is removed while the step of removing the second sacrificial pattern is performed and at least one second fin structure is formed while the step of forming the at least one first fin structure is performed.

In one embodiment of the present invention, the first fin structure has a width in a range of 10 nanometers to 15 nanometers, the second fin structure has a width in a range of 10 nanometers to 15 nanometers, and the monitor structure has a width in a range of 45 nanometers to 80 nanometers.

In one embodiment of the present invention, the first fin structure is formed in a logic region, the second fin structure is formed in a memory region, and the monitor structure is formed in a monitor region.

In one embodiment of the present invention, any adjacent layers of the second multiple layer structure are made of different materials and a topmost layer thereof and the first spacer have different etching rates.

In one embodiment of the present invention, any adjacent layers of the first multiple layer structure are made of different materials and a topmost layer thereof and the second spacer have different etching rates.

In one embodiment of the present invention, the step of forming the first multiple layer structure includes forming a nitride layer and an oxide layer on the substrate in sequence. In addition, the step of forming the second spacer includes that forming another nitride layer on the oxide layer and the second sacrificial pattern conformally and then etching back the another nitride layer.

In one embodiment of the present invention, the step of forming the second multiple layer structure includes forming a silicon layer and a nitride layer on the first multiple layer in sequence. Additionally, the step of forming the first spacer includes forming an oxide layer on the nitride layer and the first sacrificial pattern conformally and then etching back the oxide layer.

In one embodiment of the present invention, the method includes that forming a shallow trench in the substrate, filling an insulating material layer into the shallow trench, and performing a planarization process to the insulating material layer.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
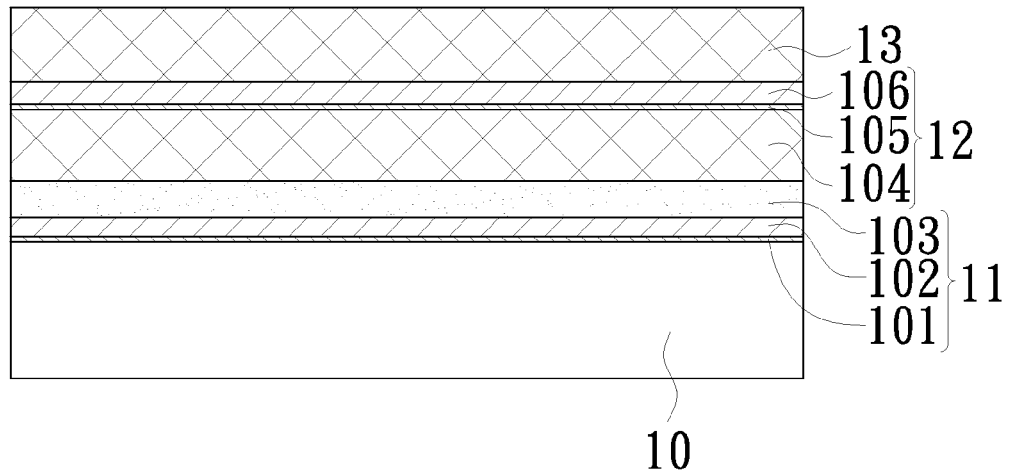
FIGS. 1-19 schematically illustrate cross-section views of processes of manufacturing a finFET device according to the first embodiment of the present invention.

FIGS. 1-19 schematically illustrate cross-sectional views of processes of manufacturing a finFET device according to the first embodiment of the present invention. The first embodiment of the present invention includes several steps. With reference to FIG. 1, a substrate 10 is provided firstly. The substrate 10 may be a silicon substrate or a silicon substrate with impurities. Then, multiple layers are stacked on the substrate 10. For instance, a first multiple layer structure 11 and a second multiple layer structure 12 are formed on the substrate 10 sequentially. Both the first multiple layer structure 11 and the second multiple layer structure 12 have more than two layers made of different materials and any adjacent layers are being made of different materials, respectively.

In one embodiment of the present invention, the step of forming the first multiple layer structure 11 may include forming a buffer layer 101, a bottom layer 102, and a top layer 103 on the substrate 10 in sequence; the step of forming the second multiple layer structure 12 may include forming a sacrificial layer 104, a buffer layer 105, and a dielectric layer 106 on the top layer 103 in sequence. The buffer layer 101, the bottom layer 102, the top layer 103, the buffer layer 105, and the dielectric layer 106 may be made of silicon oxide or silicon nitride; the sacrificial layer 104 may be made of polysilicon or amorphous silicon. It is to be noted that any two adjacent layers of those abovementioned material layers stacked on the substrate 10 have different etching rates. In addition, the buffer layers 101 and 105 are optional. In some embodiments, for example, the buffer layer 101 is not included in the first multiple layer structure 11 and/or the buffer layer 105 is not included in the second multiple layer structure 12. The first multiple layer structure 11 and the second multiple layer structure 12 may be formed by a physical vapor deposition technique, a chemical vapor deposition technique, an atomic layer deposition technique, a thermal oxidation technique, or other techniques. In other embodiments, many different material layers may be stacked on the second multiple layer structure 12 in sequence.

Figure 2:
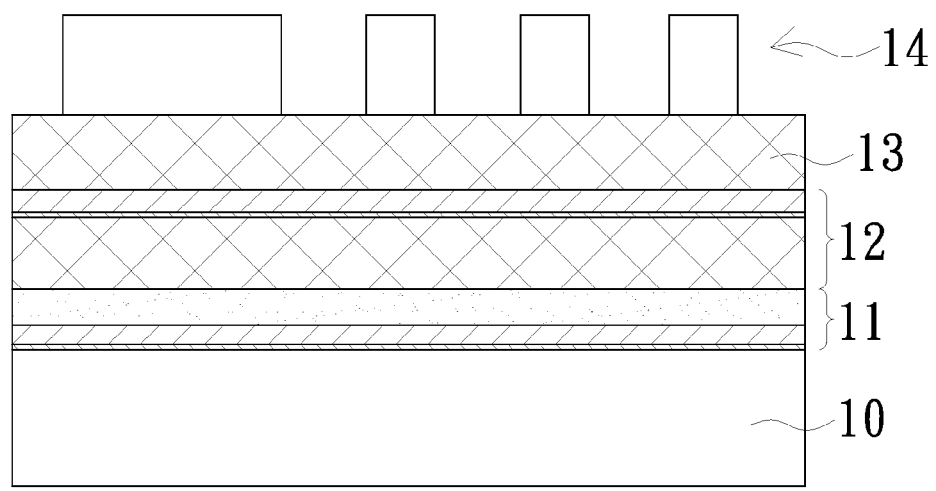
Figure 3:
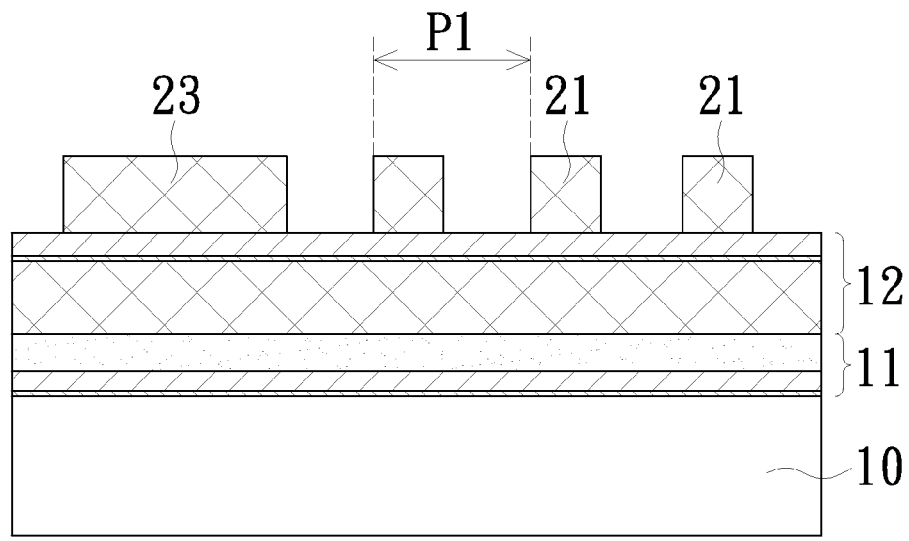

Next, a step of forming a first sacrificial pattern 21 and a first big mandrel 23 is performed. In the embodiment, the step may include: a sacrificial layer 13 is formed on the second multiple layer structure 12 and may be made of polysilicon or amorphous silicon; a photoresist layer (not shown) is formed on the sacrificial layer 13 and may be single layer or triple layer structure; after that, a patterned photoresist layer 14 (as shown in FIG. 2) is formed on the sacrificial layer 13 by performing a lithography process with a photomask; and a portion of the sacrificial layer 13 is then etched by using the patterned photoresist layer 14 as a hard mask so as to form at least one first sacrificial pattern 21 and the first big mandrel 23 and expose partial surfaces of the second multiple layer structure 12 (as shown in FIG. 3). It is to be noted that a pitch P1 between any adjacent first sacrificial patterns 21 may be 128 nanometers. In the embodiment, the sacrificial layer 13 may be etched by an anisotropic etching process, e.g. dry etching with etching gas, such as, carbon tetrafluoride ($CF_4$)/nitrogen ($N_2$) or chlorine ($Cl_2$).

Figure 4:
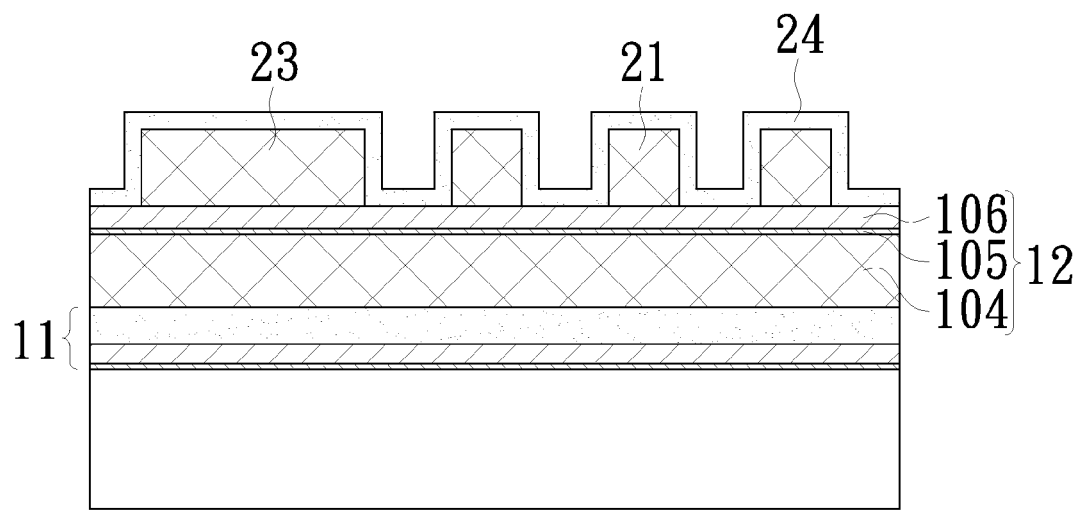
Figure 5:
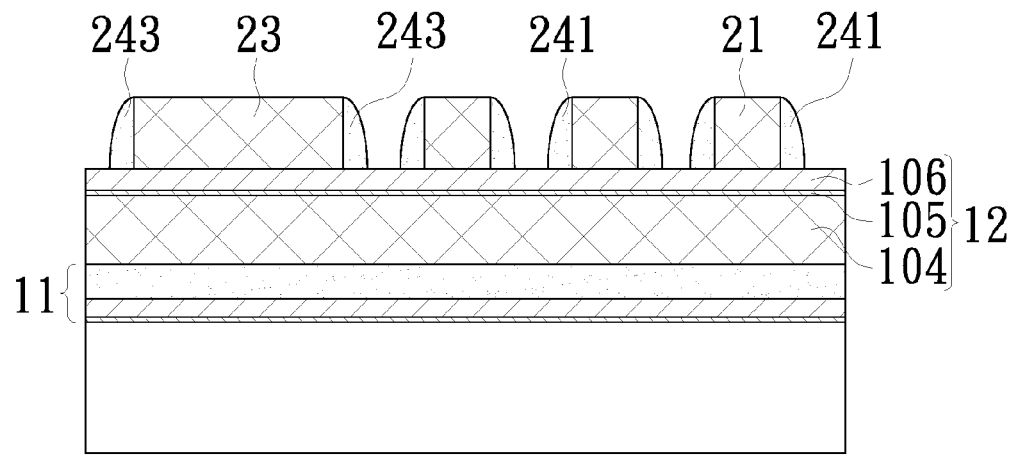
Figure 6:
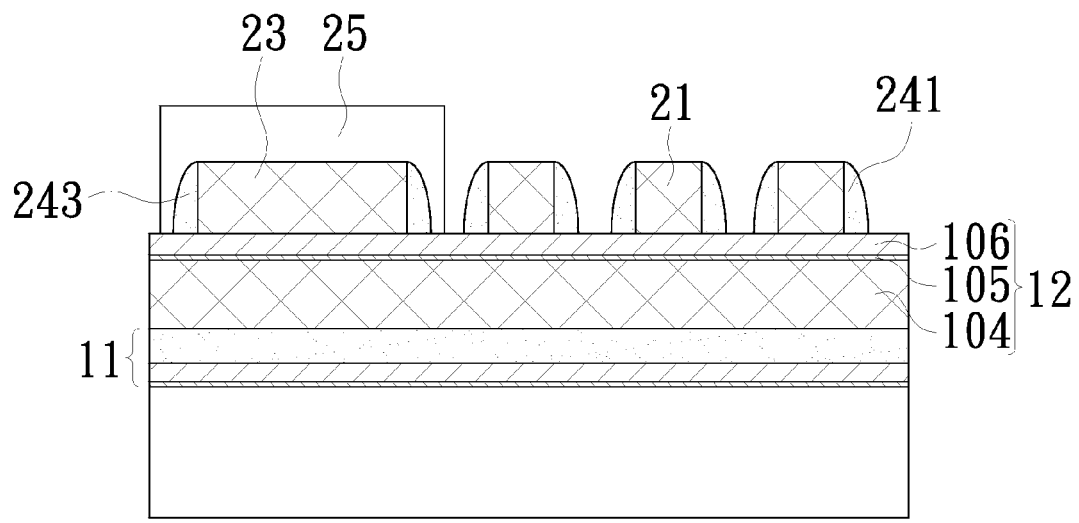

A step of forming a plurality of first spacers is then performed. In the embodiment, the step may include: firstly, a first material layer 24 is conformally formed on the first sacrificial patterns 21 and the first big mandrel 23, as shown in FIG. 4, and in contact with the exposed surfaces of the second multiple layer structure 12; the first material layer 24 is next etched back to form a plurality of first spacers 241 on sidewalls of the first sacrificial patterns 21 and to form a pair of first spacers 243 on sidewalls of the first big mandrel 23. With reference to FIG. 5, the etching back process, may be an anisotropic etching process, is used to form sail-shaped first spacers 241 and 243. It is worth mentioning that there is high etching selectivity ratio between the first material layer 24 and the first sacrificial pattern 21 and between the first material layer 24 and the first big mandrel 23 in the etching back process. Thus, the etching back process may stop while surfaces of the first sacrificial pattern 21 and the first big mandrel 23 are exposed. Additionally, there is high etching selectivity ratio between the first material layer 24 and the underlying dielectric layer 106 in the etching back process. For example, the first material layer 24 is made of silicon oxide and the dielectric layer 106 is made of silicon nitride, and the materials of both may be exchanged.

Figure 7:
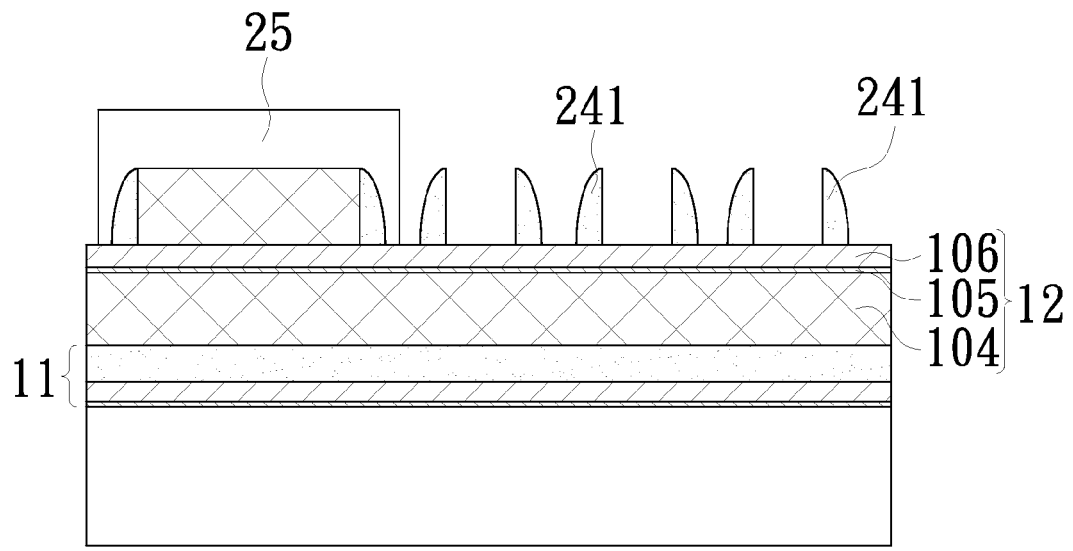
Figure 8:
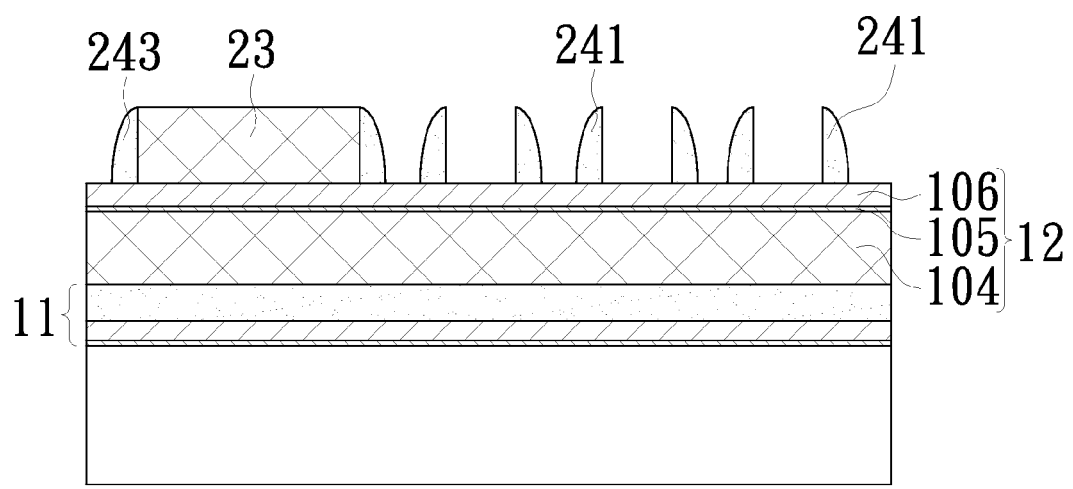

After that, the first sacrificial pattern 21 is removed and those first spacers 241 are remained. Each of the first sacrificial pattern 21 surrounded by a pair of the first spacers 241 may be etched completely in a general etching process, e.g. dry etching or wet etching, and then a portion of surfaces of the dielectric layer 106 are exposed, as shown in FIG. 7. In the embodiment of the present invention, please see FIG. 6 to FIG. 8, it is to be noted that the first big mandrel 23 and the first spacers 243 are covered by a photoresist layer 25 before the first sacrificial patterns 21 are removed; and the photoresist layer 25 is removed after the first sacrificial patterns 21 are removed completely so as to expose the first big mandrel 23 and the first spacers 243 again. That is, the photoresist layer 25 is capable of preventing the first big mandrel 23 from being removed when the removal of the first sacrificial patterns 21 is performed. In the wet etching process, etchants may be selected form ammonia, phosphoric acid, tetramethylammonium hydroxide (TMAH) or any combination thereof.

Figure 9:
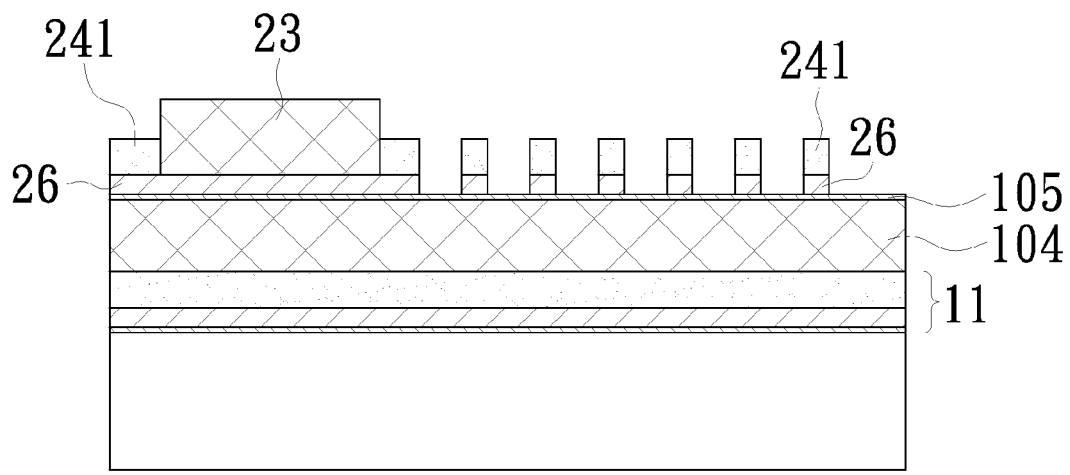

Next, a first pattern transfer process is performed. Regarding to FIG. 8, more specifically, the patterns of each of the first spacers 241, the first big mandrel 23 and the first spacers 243 may be transferred to the second multiple layer structure 12. The first pattern transfer process in the embodiment may include several general etching processes. As shown in FIG. 9, for instance, a portion of dielectric layer 106 of the second multiple layer structure 12 is removed to form a patterned dielectric layer 26 by using each of the first spacers 241, the first big mandrel 23 and the first spacers 243 as a hard mask; a portion of the buffer layer 105 is then removed to form a patterned buffer layer 27 by using the first spacers 241 and 243 as a hard mask.

Figure 10:
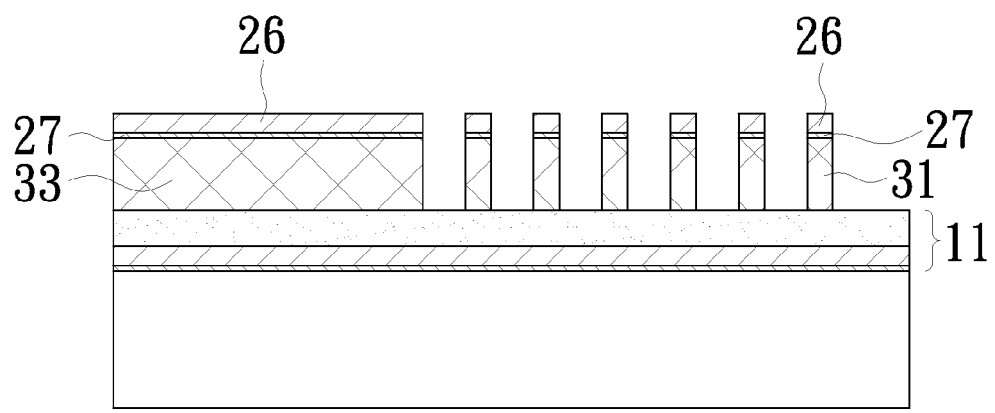
Figure 11:
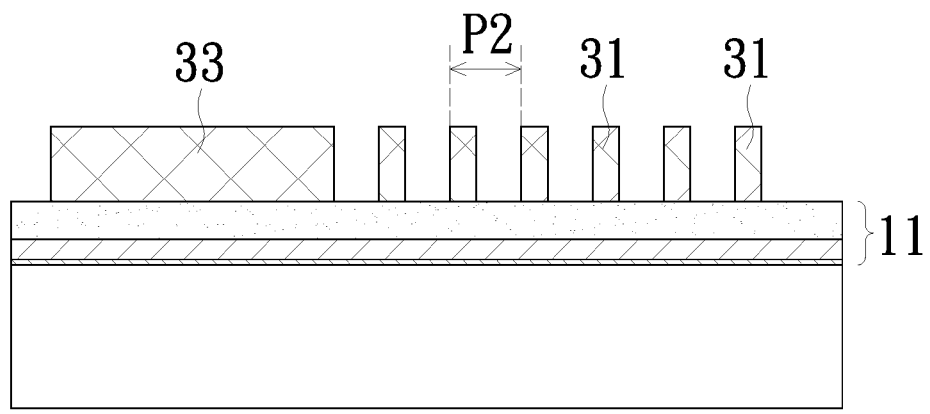

In the first pattern transfer process of the embodiment, the dielectric layer 106 (as the topmost layer of the second multiple layer structure) has a higher etching rate than the first spacers 241 and 243; the first spacers 241 and 243, however, may be partially or completely removed after the etching processes. In one embodiment of the present invention, the first spacers 241 and 243 are made of silicon oxide, the dielectric layer 106 is made of silicon nitride, and the buffer layer 105 is made of silicon oxide; besides, when the dielectric layer 106 is being etched, the first spacers 241 and 243 might be removed slightly; then, when the buffer layer 105 is being etched, the first spacers 241 and 243 might be removed completely due to the similar etching rate between the buffer layer 105 and the first spacers 241, 243. Even if the first spacers 241 and 243 are entirely removed, the patterned dielectric layer 26 and the patterned buffer layer 27 are remained to serve as a hard mask for patterning the sacrificial layer 104, and thereby at least one second sacrificial pattern 31 and a second big mandrel 33 are formed, as shown in FIG. 10. Thus, the first pattern transfer process, also called sidewall image transfer (SIT) process, is completed. It is to be noted that the first big mandrel 23 may be removed along with the step of patterning the sacrificial layer 104. Thus, a stacked structure consisting of the patterned dielectric layer 26, the patterned buffer layer 27 and the second big mandrel 33 is remained on the first multiple layer structure 11.

Figure 12:
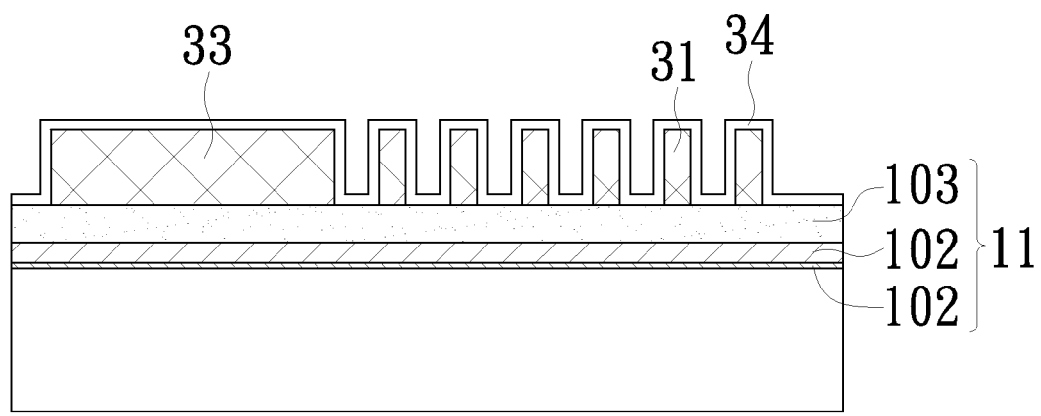
Figure 13:
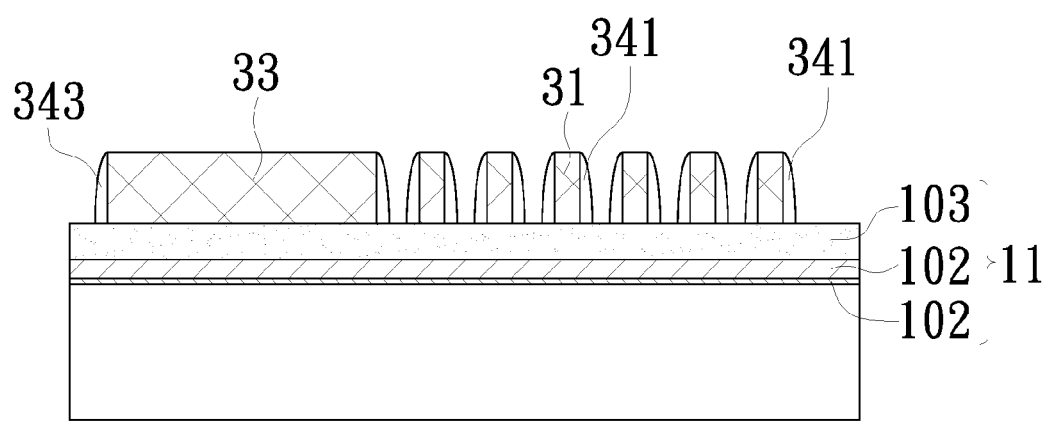

After that, a step of forming a plurality of second spacers is performed. Regarding to FIG. 11, the patterned dielectric layer 26 and the patterned buffer layer 27 are removed firstly to expose each of the second sacrificial pattern 31 and the second big mandrel 33. It is to be noted that a pitch P2 between any two adjacent second sacrificial patterns 31 may be a half of the pitch P1 of the first sacrificial patterns 21. The pitch P2 may be 64 nanometers. Then, a second material layer 34 is conformally formed on the exposed second sacrificial patterns 31 and the second big mandrel 33 and contacts with the top layer 103 of the first multiple layer structure 11, as shown in FIG. 12. The second material layer 34 is next etched back so as to form a plurality of second spacers 341 and 343 on sidewalls of each of the second sacrificial patterns 31 and that of the second big mandrel 33 respectively. Besides, the etching back process may be an anisotropic etching process so that the sail-shaped second spacers 341 and 343 are formed. It is worth mentioning that there is high etching selectivity ratio between the second material layer 34 and the second sacrificial pattern 31 and between the second material layer 34 and the second big mandrel 33 in the etching back process. Thus, the etching back process may stop while surfaces of the second sacrificial pattern 31 and the second big mandrel 33 are exposed. Additionally, an etching rate of the second material layer 34 is higher than that of the underlying top layer 103 in the etching back process. For instance, the second material layer 34 is made of silicon nitride and the top layer 103 is made of silicon oxide, and the materials of both layers may be interchanged. In one embodiment, the patterned dielectric layer 26 and the patterned buffer layer 27 may be removed by hot phosphoric acid and diluted hydrofluoric acid as etchants.

Figure 14:
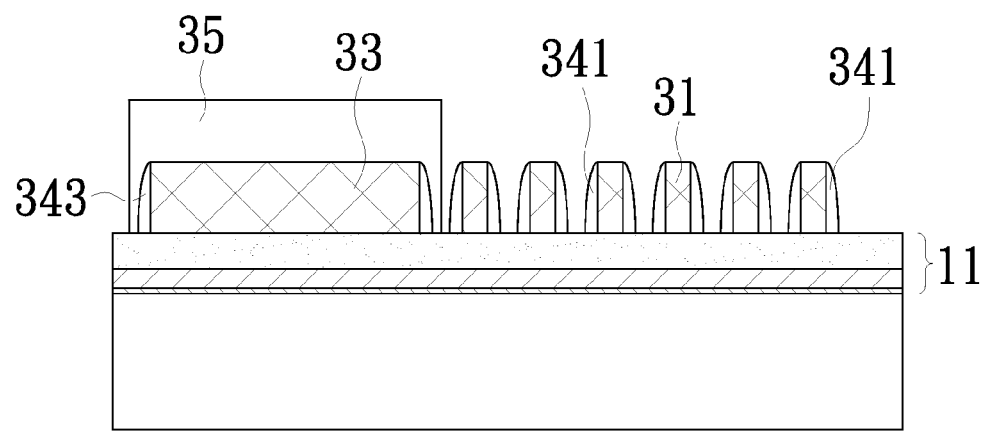
Figure 15:
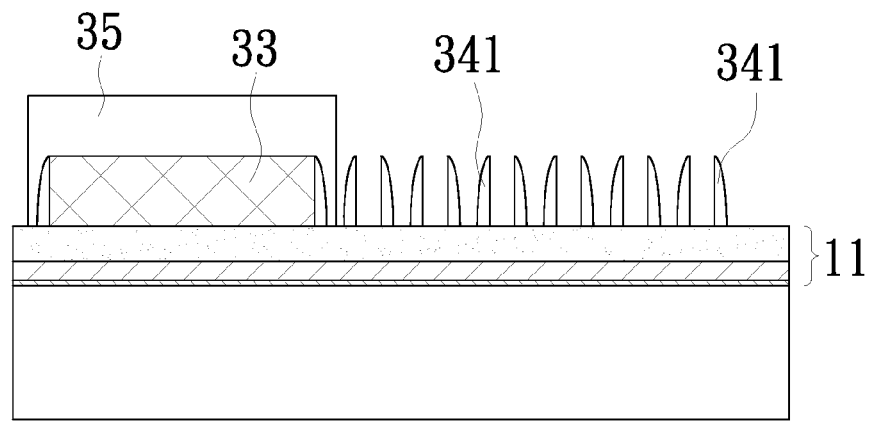
Figure 16:
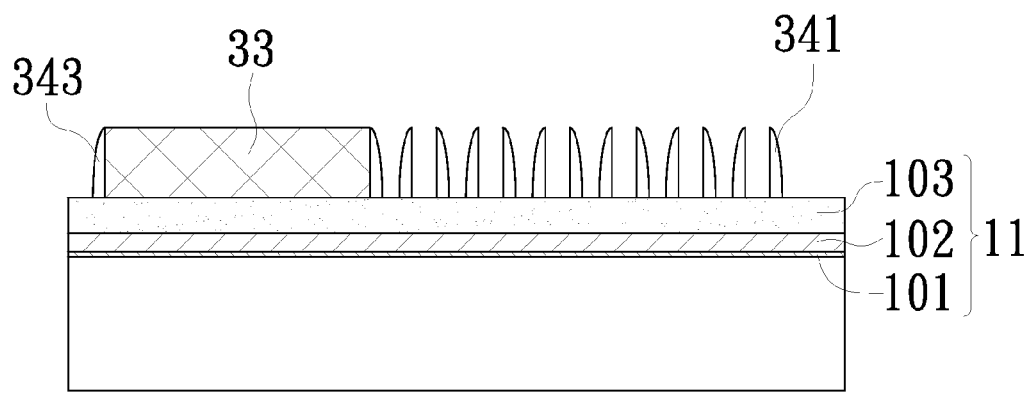

A step of removing the second sacrificial patterns 31 is then performed by a general etching process. Before the etching process is performed, as shown in FIG. 14, the second big mandrel 33 and the adjacent second spacers 343 are covered by a photoresist layer 35. Then the general etching process is performed so as to remove each of the second sacrificial patterns 31 completely, as illustrated in FIG. 15. After that, the photoresist layer 35 is removed to expose the second spacers 343 and the second big mandrel 33 surrounded thereof on the first multiple layer structure 11 as shown in FIG. 16.

Figure 17:
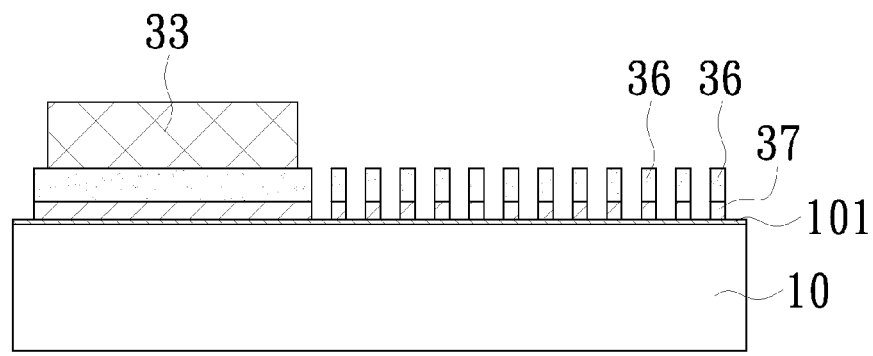

Subsequently, a second pattern transfer process is performed. More specifically, the pattern of the second spacers 341 and 343 and the second big mandrel 33 are transferred to the first multiple layer structure 11. In the embodiment of the present invention, the second pattern transfer process may include several general etching processes. For instance, the top layer 103 and the bottom layer 102 of the first multiple layer structure 11 are partially etched in sequence by using the second spacers 341 and 343 and the second big mandrel 33 as a hard mask. Thereby, a patterned top layer 36 and a patterned bottom layer 37 are formed, as shown in FIG. 17. If the first multiple layer structure 11 further includes the buffer layer 101, a patterned buffer layer 38 may be formed under the patterned bottom layer 37. In the second pattern transfer process, an etching rate of the top layer 103 (as the topmost layer of the first multiple layer structure) may be higher than that of the second spacers 341 and 343; however, the second spacers 341 and 343 are partially or completely removed. In one embodiment of the present invention, the material of the second spacers 341 and 343 is silicon nitride, the material of the top layer 103 is silicon oxide, the material of the bottom layer 102 is silicon nitride, and the material of the buffer layer 101 is silicon oxide; the second spacers 341 and 343 are removed slightly due to the etching of the top layer 103; then, the second spacers 341 and 343 are removed entirely while the bottom layer 102 is etched because an etching rate of the bottom layer 102 is similar to that of the second spacers 341 and 343, as depicted in FIG. 17. Besides, the patterned top layer 36 is removed slightly or entirely due to the etching of the buffer layer 101. In the embodiment of the present invention, after the second pattern transfer process, a patterned first multiple layer structure 401 including the patterned top layer 36, the patterned bottom layer 37 and the patterned buffer layer 38 is disposed on the substrate 10.

Figure 18:
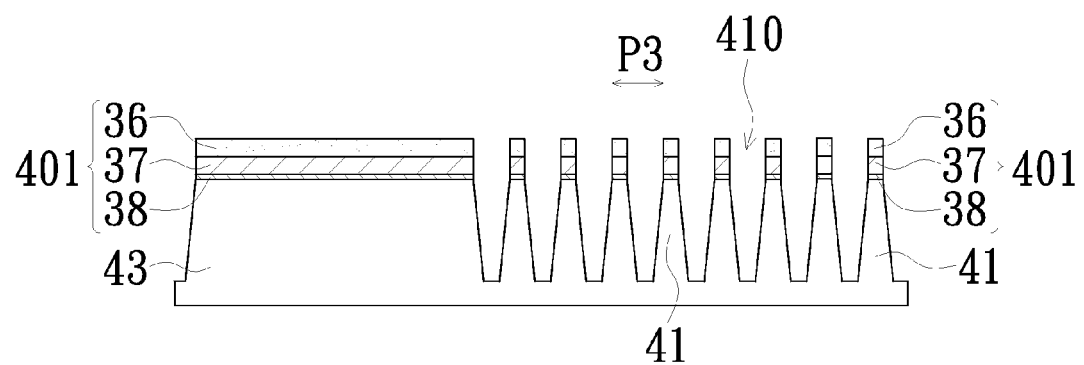

After that, a third pattern transfer process is performed. In other words, at least one first fin structure 41 is formed, as shown in FIG. 18, by using the patterned first multiple layer structure 401 as a hard mask to etch a portion of the substrate 10. Meanwhile, at least one shallow trench 410 is defined between the adjacent first fin structures 41. Please see FIG. 17 and FIG. 18, the second big mandrel 33 may be removed concurrently so as to remain the underlying patterned multiple layer structure 401 as a hard mask while the substrate 10 is etched partially aforementioned. Thus, a monitor structure 43 is defined and formed by the etching of the substrate 10. It is worth mentioning that a pitch P3 between any adjacent first fin structures 41 may be a half of the pitch P2 of the second sacrificial patterns 31. The pitch P3 may be 32 nanometers. Additionally, each of the first fin structures 41 has a width in a range of 10 nanometers to 15 nanometers and the monitor structure 43 has a width much greater than that of the first fin structures 41, such as, 45 micrometers to 80 micrometers.

Figure 19:
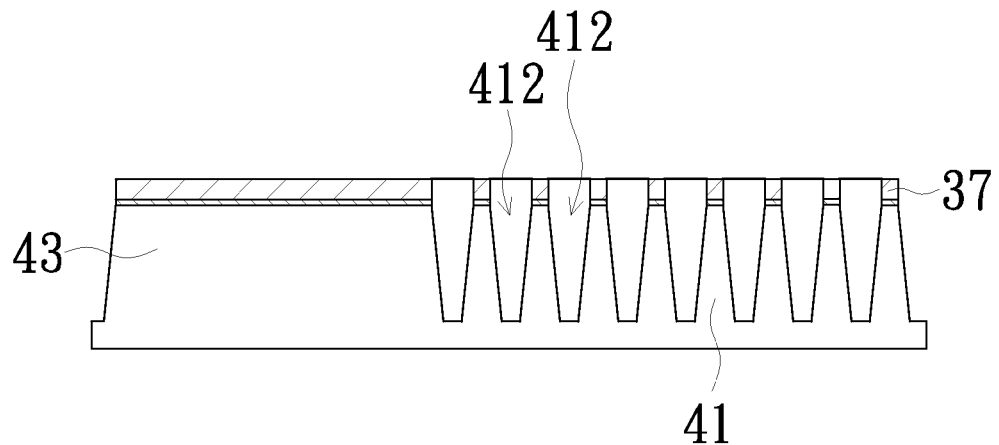

In one embodiment of the present invention, an insulating material layer (not shown) may be filled into the shallow trenches 410 and completely blanket the first fin structure 41, the monitor structures 43 and the patterned first multiple layer structure 401. Then a planarization process is performed, such as, chemical mechanical polishing (CMP), to remove a portion of the insulating material layer and thereby a plurality of shallow trench isolation structures 412 are formed and the patterned bottom layer 37 is exposed as shown in FIG. 19. In the embodiment, the monitor structure 43 is adapted to monitor thicknesses of various material layers in the following manufacturing processes.

The second embodiment of a method for manufacturing a finFET device is provided. FIG. 20 to FIG. 29 schematically depict cross-sectional views of processes according to the second embodiment of the present invention. The second embodiment is similar to the first embodiment aforementioned so that the same part may not be reiterated.

Figure 20:
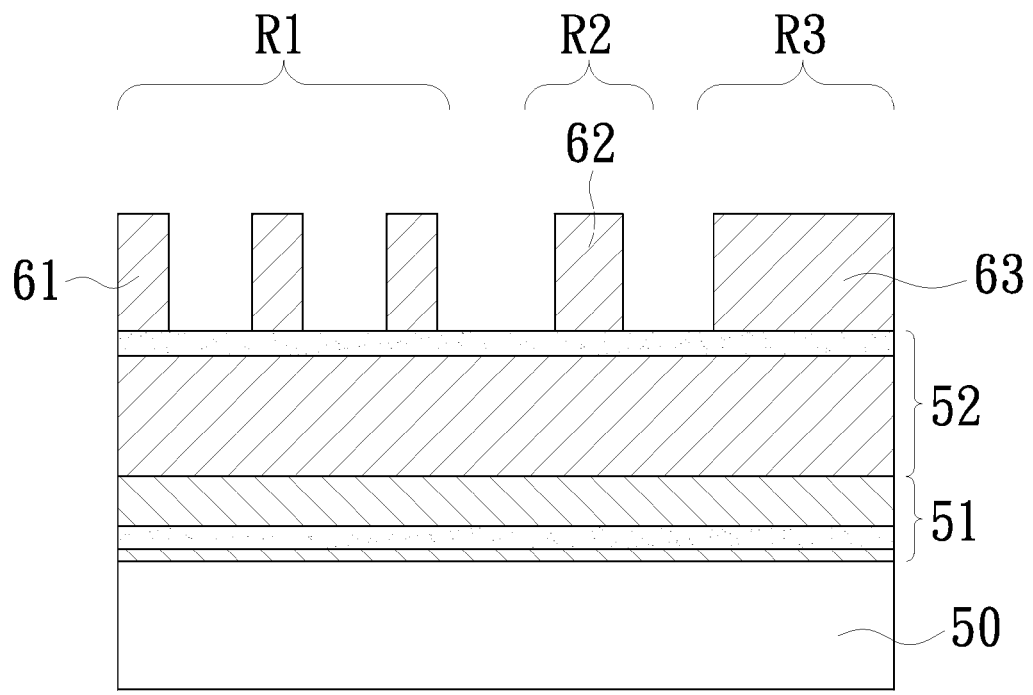
FIGS. 20-29 schematically illustrate cross-section views of processes of manufacturing a finFET device according to the second embodiment of the present invention.
Figure 21:
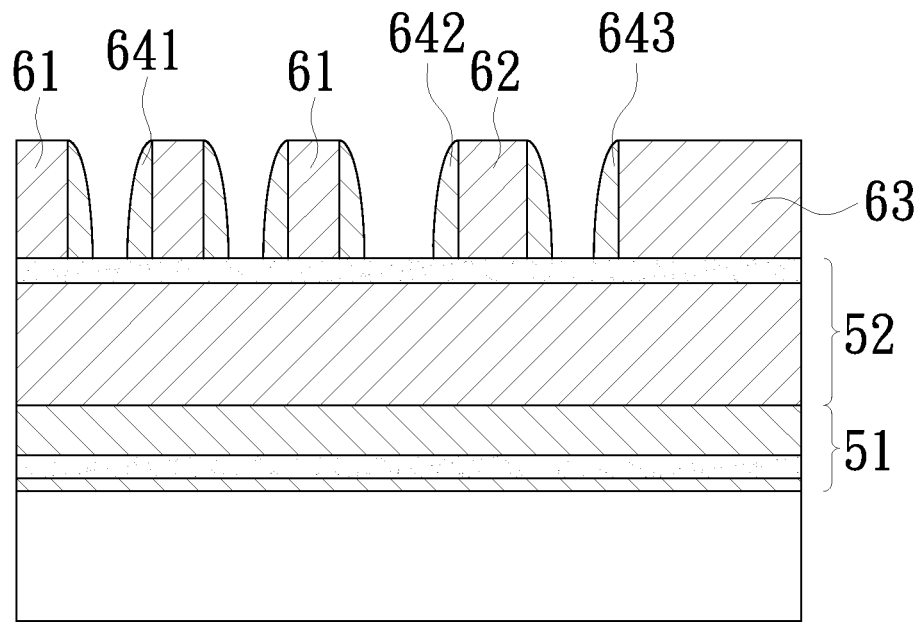

With regard to FIG. 20, a first multiple layer structure 51 and a second multiple layer structure 52 are formed on a substrate 50 in sequence. A photolithographic etching process is performed to form at least a first sacrificial pattern 61, a first middle mandrel 62 and a first big mandrel 63 on the second multiple layer structure 52. The first sacrificial pattern 61, the first middle mandrel 62 and the first big mandrel 63 are disposed in a logic region R1, a memory region R2 and a monitor region R3, respectively. The order of width is the first big mandrel 63, the first middle mandrel 62 and the first sacrificial pattern 61 from the biggest to the smallest. As shown in FIG. 21, a plurality of sail-shaped first spacers 641, 642 and 643 are respectively formed on sidewalls of each of the first sacrificial patterns 61, the first middle mandrel 62 and the first big mandrel 63.

Figure 22:
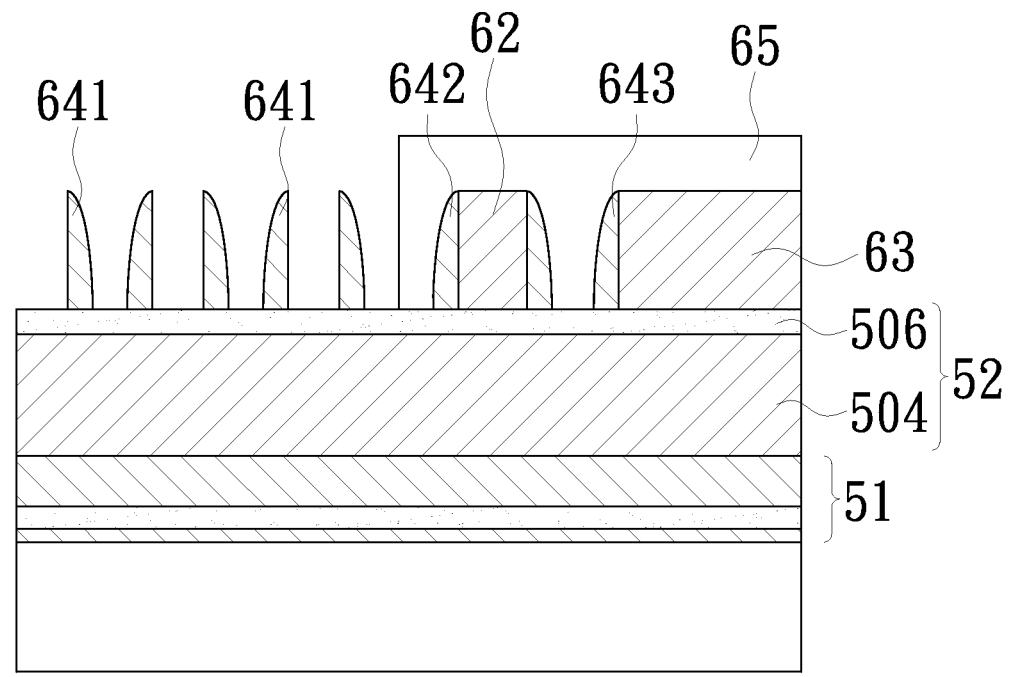

Please see FIG. 22, after the first middle mandrel 62, the first spacers 642, the first big mandrel 63 and the first spacers 643 are covered by a photoresist layer 65, the first sacrificial patterns 61 are removed by a general etching process. In one embodiment of the present invention, the first sacrificial patterns 61 are made of amorphous silicon or polysilicon, and the first spacers 641 are made of silicon oxide. Besides, the general etching process is performed to completely remove the first sacrificial patterns 61 and to have the adjacent first spacers 641 remain on the second multiple layer structure 52 by virtue of an etching rate of the first sacrificial patterns 62 being higher than that of the first spacers 641. In one embodiment of the present invention, the second multiple layer structure 52 includes a dielectric layer 506 and a sacrificial layer 504. The material of the sacrificial layer 504 may be amorphous silicon or polysilicon.

Figure 23:
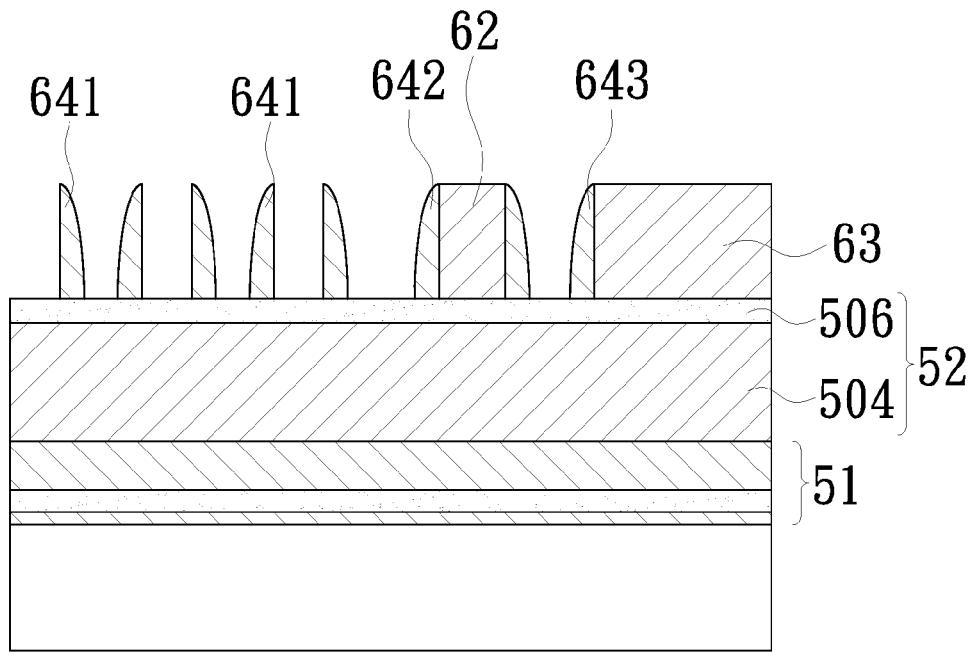
Figure 24:
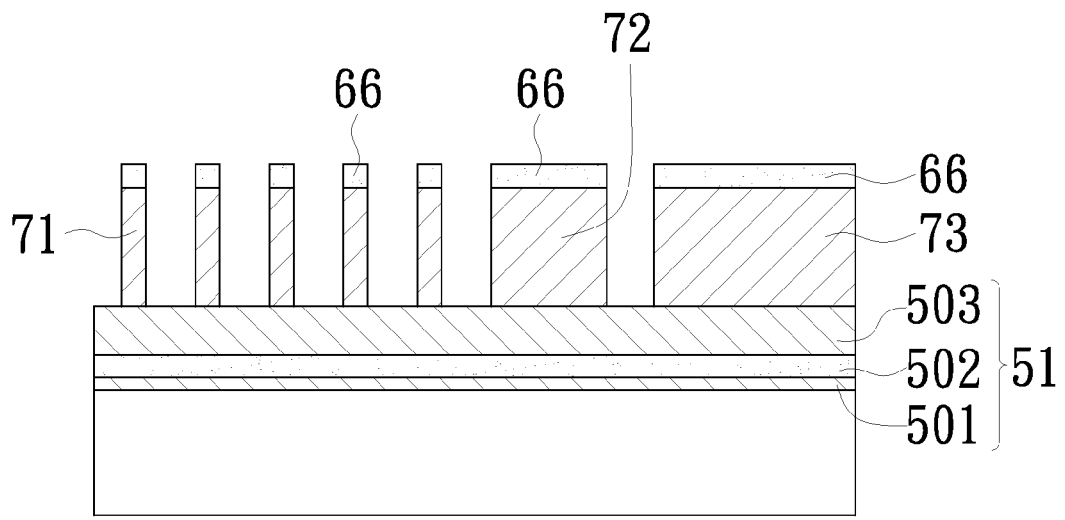

Regarding to FIG. 23, after the photoresist layer 65 is removed, a first pattern transfer process is performed so as to transfer the pattern to the second multiple layer structure 52. In other words, the remained first spacers 641, the exposed first middle mandrel 62 and the adjacent first spacers 642, the exposed first big mandrel 63 and the adjacent first spacers 643 are used as a hard mask to etch parts of the dielectric layer 506. A patterned dielectric layer 66 is formed thereby as shown in FIG. 24. Besides, an etching rate of the dielectric layer 506 in the etching process is higher than that of the first spacers 641, 642, and 643 so that the first spacers 641, 642, and 643 may be removed slightly. Then, the remained first spacers 641, 642, and 643 and the patterned dielectric layer 66 are used as a hard mask to further etch parts of the sacrificial layer 504 so that at least one second sacrificial pattern 71, a second middle mandrel 72 and a second big mandrel 73 are formed on the first multiple layer structure 51. In addition, the first middle mandrel 62, the first big mandrel 63 and the sacrificial layer 504 may be removed concurrently by virtue of their similar etching rate.

Figure 25:
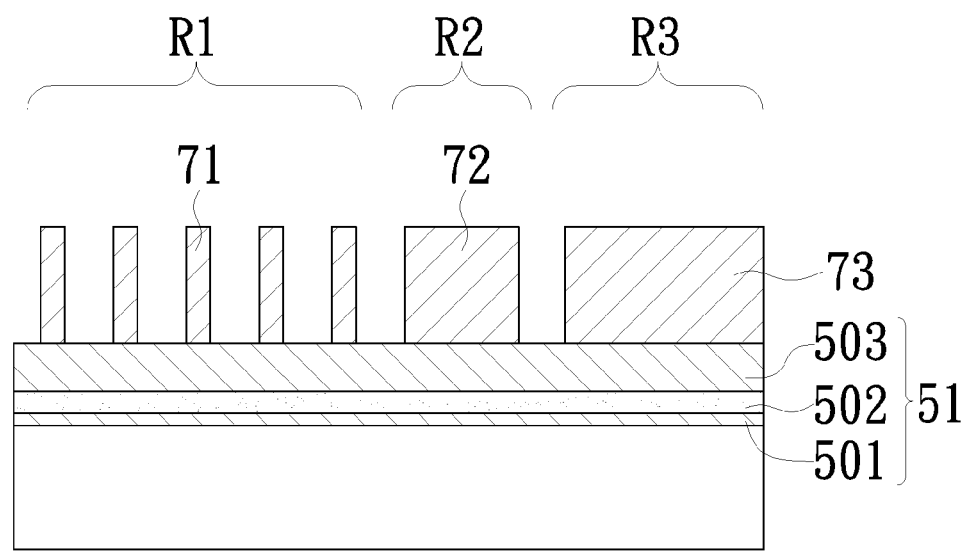
Figure 26:
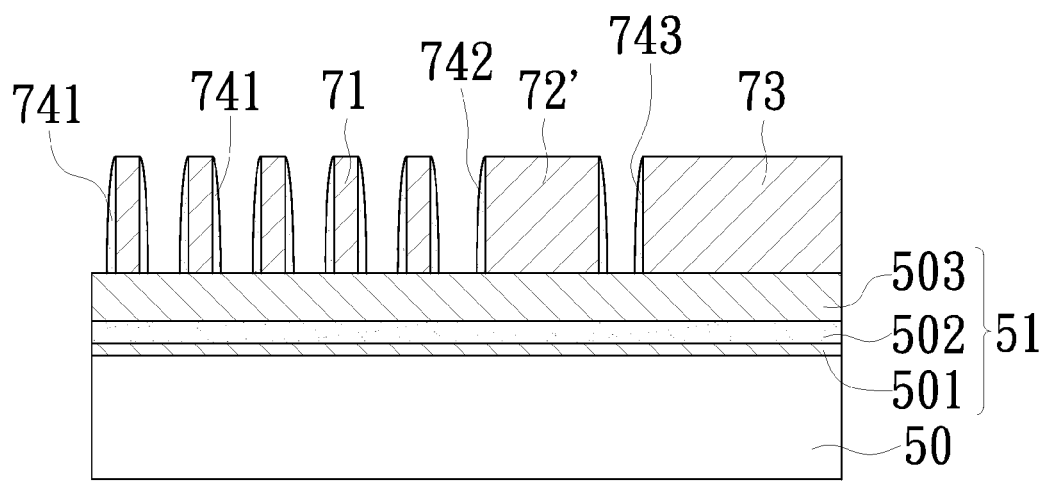
Figure 30:
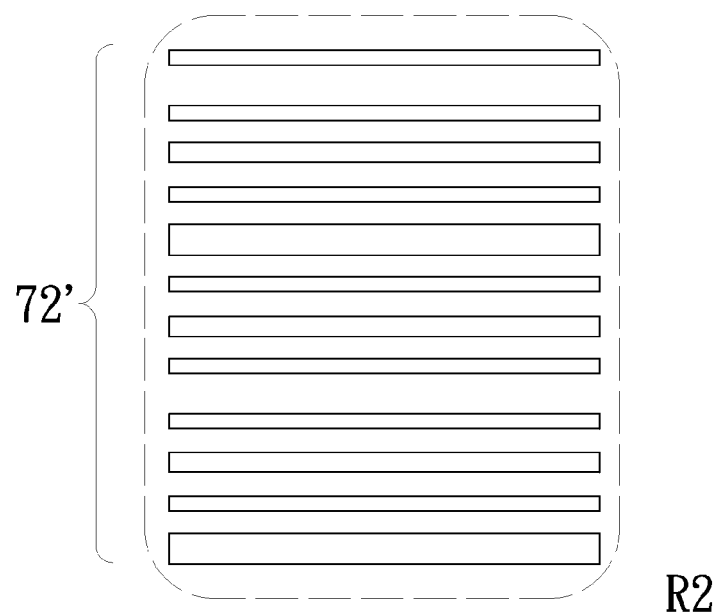
FIG. 30 schematically illustrates a top view of the patterned second middle mandrel according to the second embodiment of the present invention.

As shown in FIG. 25, the patterned dielectric layer 66 is then etched by hot phosphoric acid. After that, the second middle mandrel 72 is patterned in accordance with the need for the memory region R2 so as to form a patterned second middle mandrel 72' as shown in FIG. 30 (from top view). Subsequently, a plurality of sail-shaped second spacers 741, 742, 743 are formed on sidewalls of the second sacrificial pattern 71, the patterned second middle mandrel 72' and the second big mandrel 73, respectively, as shown in FIG. 26. In one embodiment of the present invention, the first multiple layer structure 51 may include a buffer layer 501, a bottom layer 502 and a top layer 503 disposed on the substrate 50 in sequence. There is a high etching selectivity ratio between the top layer 503 and the second spacers 741, 742 and 743. For instance, the second spacers 741, 742, 743 are made of silicon nitride, the top layer 503 is made of silicon oxide, the bottom layer 502 is made of silicon nitride and the buffer layer 501 is made of silicon oxide.

Figure 27:
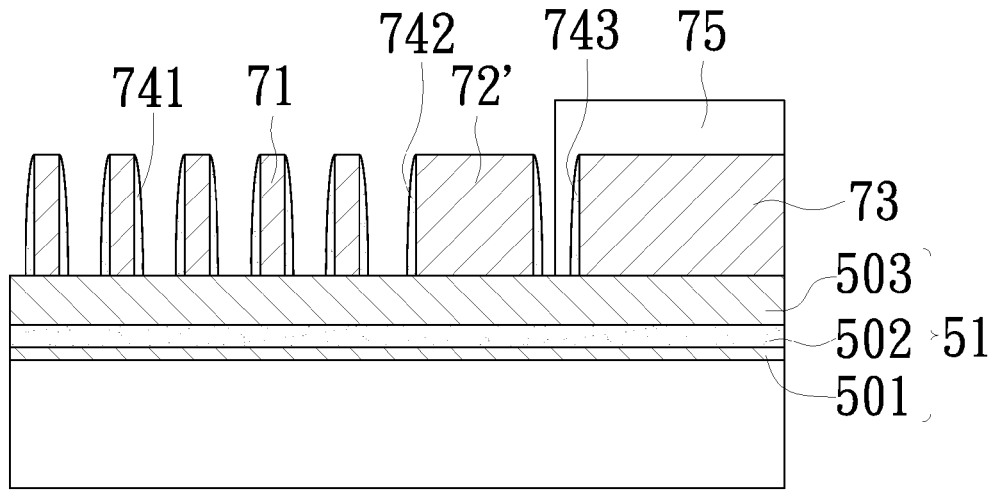

With reference to FIG. 27, after the second big mandrel 73 and the second spacers 743 are covered by a photoresist layer 75, the second sacrificial pattern 71 and the patterned second middle mandrel 72' are removed completely and the second spacers 741 and 742 are remained on the first multiple layer structure 51 because the second sacrificial pattern 71 and the patterned second middle mandrel 72' have higher etching rates than the second spacers 741 and 742.

Figure 28:
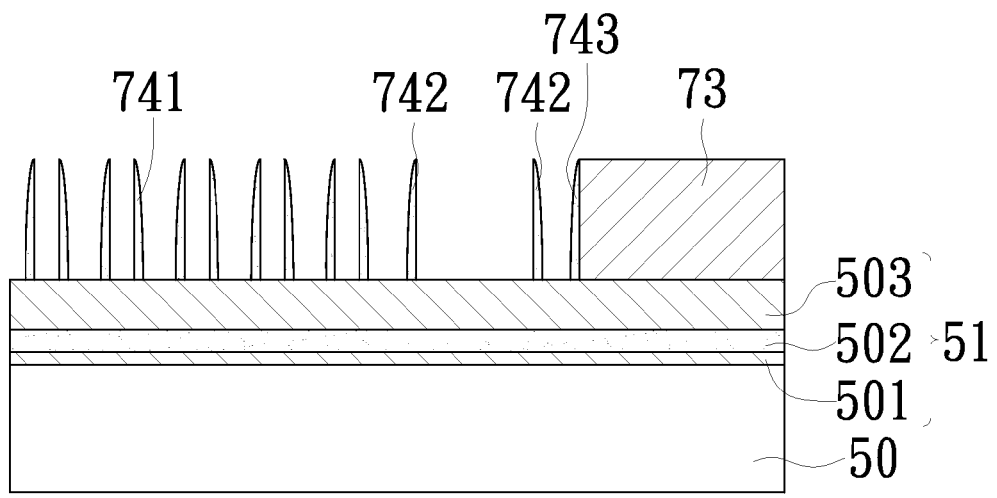

Please see FIG. 28, after the photoresist layer 75 is removed, a second pattern transfer process is than performed to transfer a pattern disposed on the first multiple layer structure 51 to the first multiple layer structure 51. In other words, a patterned first multiple layer structure 801 is formed by using the remained second spacers 741, 742, the exposed second big mandrel 73 and the adjacent second spacers 743 as a hard mask to etch parts of the first multiple layer structure 51. The patterned first multiple layer structure 801 may include a patterned top layer 84, a patterned bottom layer 85 and a patterned buffer layer 86.

Figure 29:
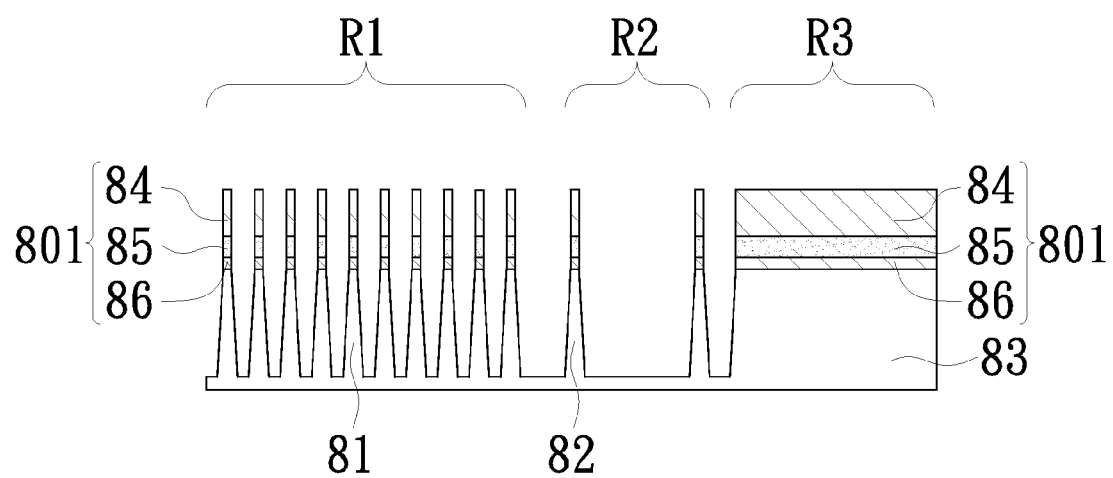

Finally, as shown in FIG. 29, a third pattern transfer process is performed. That is, a portion of the substrate 50 is etched by using the patterned first multiple layer structure 801 as a hard mask, and thereby at least one first fin structure 81, at least one second fin structure 82 and a monitor structure 83 are formed on the logic region R1, the memory region R2 and the monitor region R3, respectively. In some embodiments, the manufacturing processes of the finFET device may proceed further.

It is to be noted that a width of the first fin structures 81 may range from 10 nanometers to 15 nanometers, that of the second fin structures 82 may range from 10 nanometers to 15 nanometers, and that of the monitor structure 83 may range from 45 micrometers to 80 micrometers. Moreover, a pitch between the adjacent first fin structures 81 is a half of a pitch between the adjacent second sacrificial patterns 71 and a quarter of a pitch between the adjacent first sacrificial patterns 61. After the device structure depicted in FIG. 29 is formed, more processes may proceed, such as, forming shallow trench isolation structures, or forming gate structures, etc.

In summary, in the present invention, multiple sidewall image transfer (SIT) processes are used to make a plurality of fin structures with smaller pitches. More specifically, the pattern of the spacers adjacent to the sacrificial pattern over the substrate, as being a hard mask, is transferred to the multiple layer structure on the substrate; and the patterned multiple layer structure, as being a hard mask, is further transferred to the substrate; and thereby smaller fin structures are made. Meanwhile, structures needed for different function regions in the device are formed concurrently during the multiple SIT processes. Consequently, in the present invention, a plurality of miniaturized finFET devices are completed regardless of the limitation of lithography process and costs and time of the processes may be effectively conserved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a finFET device, comprising steps of:

forming a first multiple layer structure and a second multiple layer structure on a substrate in sequence;

forming a first sacrificial pattern on said second multiple layer structure;

forming a first spacer on a sidewall of said first sacrificial pattern;

removing said first sacrificial pattern;

etching a portion of said second multiple layer structure by using said first spacer as a hard mask, thereby forming a second sacrificial pattern;

forming a second spacer on a sidewall of said second sacrificial pattern;

removing said second sacrificial pattern;

patterning said first multiple layer structure by using said second spacer as a hard mask; and etching a portion of said substrate by using said patterned first multiple layer structure as a hard mask, thereby forming at least one first fin structure.

2. The method according to claim 1, wherein a first big mandrel is formed on said second multiple layer structure while said step of forming said first sacrificial pattern on said second multiple layer structure is performed, and the method further comprising steps of:

covering said first big mandrel before said step of removing said first sacrificial pattern; and exposing said first big mandrel after said step of removing said first sacrificial pattern, wherein said first big mandrel is removed while said step of etching said portion of said second multiple layer structure is performed.

3. The method according to claim 2, wherein a first middle mandrel is formed on said second multiple layer structure while said step of forming said first sacrificial pattern on said second multiple layer structure is performed, said first middle mandrel is covered while said step of covering said first big mandrel is performed, said first middle mandrel is exposed while said step of exposing said first big mandrel is performed, and said first middle mandrel is removed while said step of etching said portion of said second multiple layer structure.

4. The method according to claim 1, wherein a second big mandrel is formed on said first multiple layer structure while said step of forming a second sacrificial pattern is performed, and the method further comprising steps of:

covering said second big mandrel before said step of removing said second sacrificial pattern; and exposing said second big mandrel after said step of removing said second sacrificial pattern, wherein said second big mandrel is removed and a monitor structure is formed while said step of forming said at least one first fin structure is performed.

5. The method according to claim 4, wherein a second middle mandrel is formed on said first multiple layer structure while said step of forming a second sacrificial pattern is performed, and the method further comprising a step of:

patterning said second middle mandrel before said step of forming said second spacer, wherein said patterned second middle mandrel is removed while said step of removing said second sacrificial pattern is performed, wherein at least one second fin structure is formed while said step of forming said at least one first fin structure is performed.

6. The method according to claim 5, wherein said at least one first fin structure has a width in a range of 10 nanometers to 15 nanometers, said at least one second fin structure has a width in a range of 10 nanometers to 15 nanometers, and said monitor structure has a width in a range of 45 nanometers to 80 nanometers.

7. The method according to claim 5, wherein said at least one first fin structure is formed in a logic region, said at least one second fin structure is formed in a memory region, and said monitor structure is formed in a monitor region.

8. The method according to claim 1, wherein any adjacent layers of said second multiple layer structure are made of different materials and a topmost layer thereof and said first spacer have different etching rates.

9. The method according to claim 1, wherein any adjacent layers of said first multiple layer structure are made of different materials and a topmost layer thereof and said second spacer have different etching rates.

10. The method according to claim 1, wherein said step of forming said first multiple layer structure comprises forming a nitride layer and an oxide layer on said substrate in sequence, and said step of forming said second spacer comprises:

forming another nitride layer on said oxide layer and said second sacrificial pattern conformally; and etching back said another nitride layer.

11. The method according to claim 1, wherein said step of forming said second multiple layer structure comprises forming a silicon layer and a nitride layer on said first multiple layer in sequence, and said step of forming said first spacer comprises:

forming an oxide layer on said nitride layer and said first sacrificial pattern conformally; and etching back said oxide layer.

12. The method according to claim 1, further comprising:

forming a shallow trench in said substrate;

filling an insulating material layer into said shallow trench; and performing a planarization process to said insulating material layer.

* * * * *